United States Patent [19]
Smith

[11] Patent Number: 5,533,136
[45] Date of Patent: Jul. 2, 1996

[54] CIRCUIT FOR ATTENUATING COMMERCIAL INTERRUPTIONS DURING RADIO BROADCASTING

[76] Inventor: Terry L. Smith, 3246 S. 61st Ave., Cicero, Ill. 60650

[21] Appl. No.: 145,582

[22] Filed: Nov. 4, 1993

[51] Int. Cl.⁶ .................................................. H03G 3/00
[52] U.S. Cl. .............................................. 381/107; 381/56
[58] Field of Search .............................. 381/56, 57, 104, 381/107; 455/197.1, 197.3, 166.1; 358/908

[56] References Cited

U.S. PATENT DOCUMENTS

| | | | |
|---|---|---|---|
| 3,321,581 | 5/1967 | Zryd et al. | 381/107 |
| 3,873,926 | 3/1975 | Wright | 381/107 |
| 4,044,309 | 8/1977 | Smith | 381/107 |
| 4,162,457 | 7/1979 | Grodinsky | 381/107 |
| 4,292,467 | 9/1981 | Odlen et al. | 179/1 D |
| 4,414,689 | 11/1983 | Enderson | 381/57 |
| 4,506,377 | 3/1985 | Kishi et al. | 381/41 |
| 4,694,497 | 9/1987 | Kasai et al. | 381/56 |
| 5,107,539 | 4/1992 | Kato et al. | 381/57 |
| 5,170,490 | 12/1992 | Cannon et al. | 455/72 |
| 5,301,236 | 4/1994 | Iizuka et al. | 381/107 |

*Primary Examiner*—Forester W. Isen
*Attorney, Agent, or Firm*—Sean F. Sullivan; David L. Baker; Rhodes & Ascolillo

[57] ABSTRACT

An attenuating circuit for attenuating commercial interruptions in an audio signal, the audio signal including at least a first channel audio signal and a second channel audio signal; the attenuating circuit including a first audio channel detection circuit and a second audio channel detection circuit, each of the audio channel detection circuits including a low pass filter mechanism for receiving the audio signal and for passing only low frequency components of the audio signal, with the low frequency components being beneath a determined frequency; a low frequency comparator circuit for generating a low frequency detection signal whenever the amplitude of the low frequency components exceed a first threshold value; a high pass filter mechanism for receiving the audio signal and for passing only high frequency components of the audio signal, the high frequency components being above the determined frequency; and a high frequency comparator circuit for generating a high frequency detection signal whenever the amplitude of said high frequency components exceed a second threshold value. Finally, the circuit includes a logic circuit for receiving the low frequency detection signals and the high frequency detection signals and for generating an attenuating signal if, and only if, both of the low frequency detection signals are active and both of the high frequency detection signals are null; and an attenuation circuit for receiving the attenuation signal and for substantially attenuating the strength of the audio signal whenever the attenuation signal is active.

14 Claims, 4 Drawing Sheets

| $L_1$ | $H_1$ | $L_2$ | $H_2$ | X |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 1 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 0 |

CIRCUIT FOR ATTENUATING COMMERCIAL INTERRUPTIONS DURING RADIO BROADCASTING

BACKGROUND OF THE INVENTION

1. Field of the Invention

The present invention relates generally to a system for attenuating undesired commercial messages during radio broadcasting, and more specifically, to a circuit which attenuates radio frequency signals when voices are broadcasted without accompanying background music.

2. Description of the Related Art

U.S. Pat. No. 4,292,467 relates to a device for providing improved control mechanisms for electronic devices containing a number of mechanical adjusting means.

U.S. Pat. No. 4,506,377 discloses a device for providing a spoken-instruction controlled system for an automotive vehicle which can activate a series of actuators after a spoken instruction has been recognized by a speech recognizer.

U.S. Pat. No. 5,107,539 relates to a device for providing automatic sound volume control for use with automobile audio equipment.

U.S. Pat. No. 5,170,490 relates to improving radio transmission and receiving functions using voice compression.

SUMMARY OF THE INVENTION

In addition to broadcasting music, radio stations from time to time must also broadcast the advertisements of their sponsors. Many of these radio stations overmodulate or increase the signal amplitude of their advertisement broadcasts, causing the listener to hear the commercials at an uncomfortably loud volume.

Accordingly, it is a principal object of the present invention to provide a system for sensing and detecting radio frequency transmissions which carry human voice frequency components which are unaccompanied by background musical frequency components, and to attenuate those same transmissions.

It is a further object of the invention to provide a circuit which achieves the above object and which can be easily installed in any conventional audio system.

The present invention achieves the above objects, among others, by providing, in one aspect, an attenuating circuit for attenuating commercial interruptions in an audio signal, the attenuating circuit including: a low pass filter mechanism for receiving the audio signal and for passing only low frequency components of the audio signal, the low frequency components being beneath a determined frequency; a low frequency comparator mechanism for generating a low frequency detection signal whenever the amplitude of the low frequency components exceeds a first threshold value; a high pass filter mechanism for receiving the audio signal and for passing only high frequency components of the audio signal, the high frequency components being above the determined frequency; a high frequency comparator mechanism for generating a high frequency detection signal whenever the amplitude of the high frequency components exceeds a second threshold value; a logic mechanism for receiving the low frequency detection signal and the high frequency detection signal and for generating an attenuating signal whenever the low frequency detection signal is active and the high frequency detection signal is null; and an attenuation mechanism for receiving the attenuation signal and for substantially attenuating the strength of the audio signal whenever the attenuation signal is active.

Preferably, the attenuating circuit additionally includes an amplifying mechanism for receiving the audio signal, for amplifying the signal strength of the audio signal to produce an amplified audio signal, and for providing the amplified audio signal to each of the low pass filter and high pass filter mechanisms. The amplifying mechanism includes an AC operational amplifier; the low pass filter mechanism includes an inductor connected in series with the AC operational amplifier and a capacitor connected in parallel with the inductor. Similarly, the high pass filter mechanism includes a capacitor connected in series with the AC operational amplifier and an inductor connected in parallel with the capacitor. Each of the low and high frequency comparator mechanisms include a rectifying diode for rectifying the output of each of the low and high pass filter mechanisms, a filter capacitor connected in parallel with the rectifying diode for detecting and holding a DC signal passed by the rectifying diode, and a DC operational amplifier for comparing the passed DC signal with a DC reference voltage and for generating a DC output signal compatible with digital logic circuitry.

In another aspect, the invention generally features an attenuating circuit for attenuating commercial interruptions in an audio signal, the audio signal including at least a first channel audio signal and a second channel audio signal, the attenuating circuit including: a first audio channel detection circuit and a second audio channel detection circuit, each of which further include a low pass filter mechanism for receiving the audio signal and for passing only low frequency components of the audio signal, the low frequency components being beneath a determined frequency; a low frequency comparator mechanism for generating a low frequency detection signal whenever the amplitude of the low frequency components exceeds a first threshold value; a high pass filter mechanism for receiving the audio signal and for passing only high frequency components of the audio signal, the high frequency components being above said determined frequency; and a high frequency comparator mechanism for generating a high frequency detection signal whenever the amplitude of the high frequency components exceeds a second threshold value. The attenuating circuit additionally includes a logic mechanism for receiving the low and high frequency detection signals and for generating an attenuating signal if, and only if, both of the low frequency detection signals are active and both of the high frequency detection signals are null. Also, the attenuating circuit includes an attenuation mechanism for receiving the attenuation signal and for substantially attenuating the strength of the audio signal whenever the attenuation signal is active.

Preferably, the attenuating circuit additionally includes an amplifying mechanism for receiving the audio signal, for amplifying the signal strength of the audio signal to produce an amplified audio signal, and for providing the amplified audio signal to each of the low and high pass filter mechanisms of the first and second audio channel detection circuits. The amplifying mechanism includes a first and second AC operational amplifier; each of the low pass filter mechanisms include an inductor, and a capacitor connected in parallel with the inductor. Similarly, each of the high pass filter mechanisms include a capacitor, and an inductor connected in parallel with the capacitor. Each of the low and high frequency comparator mechanisms include a rectifying diode for rectifying the output of each of the low and high pass filter mechanisms, a filter capacitor connected in parallel with the rectifying diode for detecting and holding a DC signal passed by the rectifying diode, and a DC operational amplifier for comparing the passed DC signal with a DC reference voltage and for generating a DC output signal compatible with digital logic circuitry.

In yet another aspect, the invention generally features an attenuating circuit for attenuating commercial interruptions in an audio signal, the attenuating circuit including a first AC noninverting amplifier, the noninverting (+) terminal of which is connected to a first channel audio, the inverting (−) terminal of which is connected to the output of the first noninverting amplifier through a negative feedback resistor for fixing and stabilizing the gain of the first noninverting amplifier.

The attenuating circuit further includes a second AC noninverting amplifier, the noninverting (+) terminal of which is connected to a second channel audio signal, the inverting (−) terminal of which is connected to the output of the second noninverting amplifier through a negative feedback resistor for fixing and stabilizing the gain of the second noninverting amplifier.

The attenuating circuit further includes a first low pass filter circuit connected to the output of the first AC noninverting amplifier, the first low pass filter circuit including an LC low pass filter which further includes an inductor connected in series with the output of the first AC noninverting amplifier, and a capacitor being connected in parallel with the inductor.

The attenuating circuit further includes a first high pass filter circuit connected to the output of the first AC noninverting amplifier, the first high pass filter circuit including an LC high pass filter which further includes a capacitor connected in series with the output of the first AC noninverting amplifier, and an inductor being connected in parallel with the capacitor.

The attenuating circuit further includes a second low pass filter circuit connected to the output of the second AC noninverting amplifier, the second low pass filter circuit including an LC low pass filter which further includes an inductor connected in series with the output of the second AC noninverting amplifier, and a capacitor being connected in parallel with the inductor.

The attenuating circuit further includes a second high pass filter circuit connected to the output of the second AC noninverting amplifier, the second high pass filter network including an LC high pass filter which further includes a capacitor connected in series with the output of the second AC noninverting amplifier, and an inductor being connected in parallel with the capacitor.

The attenuating circuit further includes a first signal comparator circuit including a rectifying diode serially connected to the output of the first low pass filter circuit, a filter capacitor connected in parallel to the output of the rectifying diode for detecting and holding a passed DC signal, and a DC operational amplifier which compares the passed DC signal with a DC reference voltage and which generates an output suitable for input to digital logic circuitry.

The attenuating circuit further includes a second signal comparator circuit including a rectifying diode serially connected to the output of the first high pass filter circuit, a filter capacitor connected in parallel to the output of the rectifying diode for detecting and holding a passed DC signal, and a DC operational amplifier which compares the passed DC signal with a DC reference voltage and which generates an output suitable for input to digital logic circuitry.

The attenuating circuit further includes a third signal comparator circuit including a rectifying diode serially connected to the output of the second low pass filter circuit, a filter capacitor connected in parallel to the output of the rectifying diode for detecting and holding a passed DC signal, and a DC operational amplifier which compares the passed DC signal with a DC reference voltage and which generates an output suitable for input to digital logic circuitry.

The attenuating circuit further includes a fourth signal comparator circuit including a rectifying diode serially connected to the output of the second high pass filter circuit, a filter capacitor connected in parallel to the output of the rectifying diode for detecting and holding a passed DC signal, and a DC operational amplifier which compares the passed DC signal with a DC reference voltage and which generates an output suitable for input to digital logic circuitry.

The attenuating circuit further includes a digital logic circuit including a first inverter connected to the output of the DC operational amplifier of the second signal comparator circuit; a second inverter connected to the output of the DC operational amplifier of the fourth signal comparator circuit; a first NAND gate, one input of which is connected to the output of the DC operational amplifier of the first signal comparator circuit, the other input of which is connected to the output of the first inverter; a second NAND gate, one input of which is connected to the output of the DC operational amplifier of the third signal comparator circuit, the other input of which is connected to the output of the second inverter; and a NOR gate, one input of which is connected to the output of the first NAND gate, the other input of which is connected to the output of the second NAND gate.

The attenuating circuit further includes a low impedance signal attenuating circuit connected in parallel between an input and an output of each of the first and second audio channels, the low impedance attenuating circuit being activated by a signal connected to the output of the NOR gate, wherein a +5 volt output from the NOR gate causes the low impedance attenuating circuit to substantially attenuate the strength of the first and second channel audio signals.

Preferably, each of the DC reference voltages are obtained from the power supply of each of the DC operational amplifiers by using voltage dividing resistors.

The invention will now be described by way of a particularly preferred embodiment, reference being made to the accompanying drawings, wherein:

DESCRIPTION OF THE PREFERRED EMBODIMENT

Figure 1:
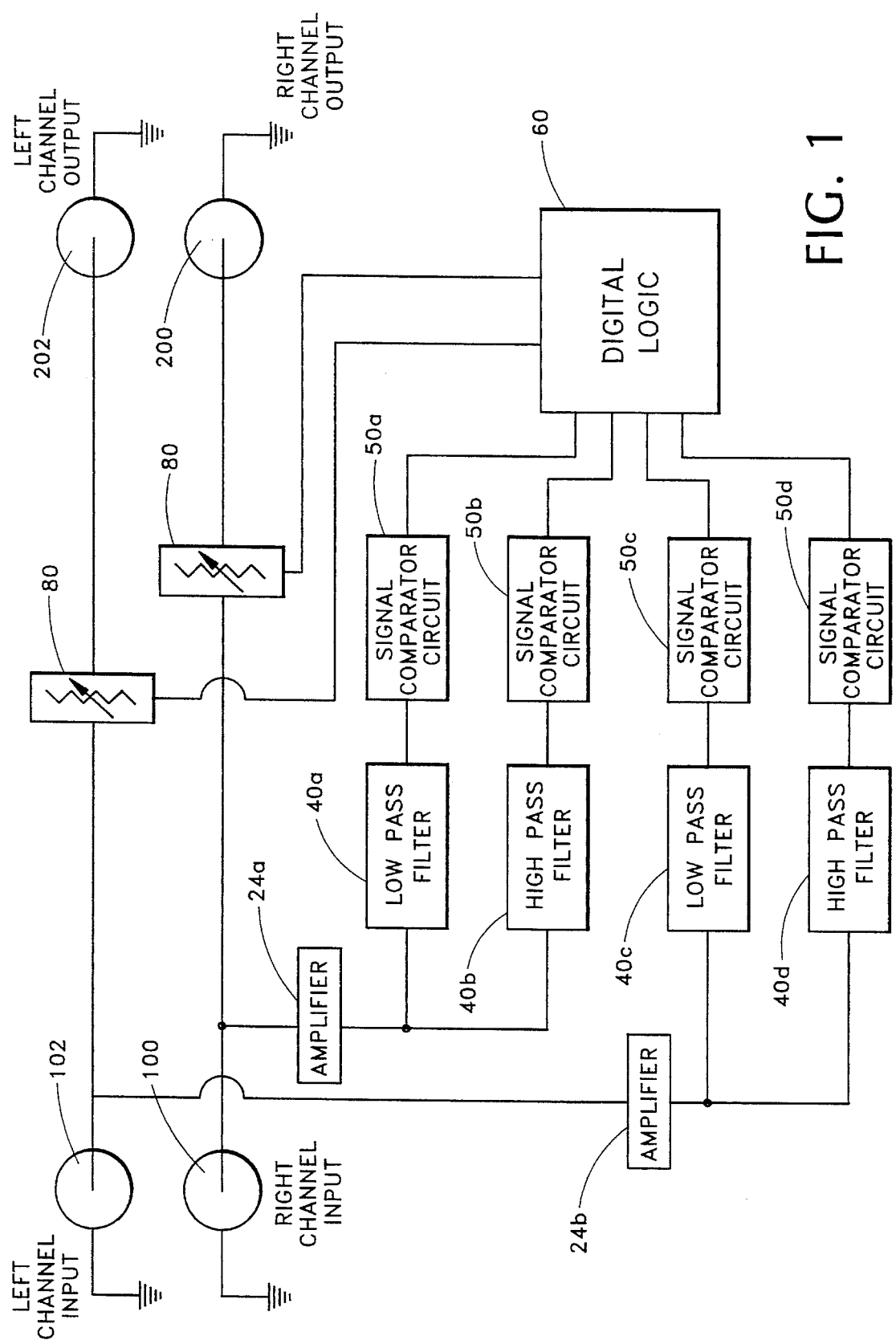
FIG. 1 is a schematic block diagram of a circuit for attenuating commercial interruptions during radio broadcasting, constructed according to the present invention.
Figure 2:
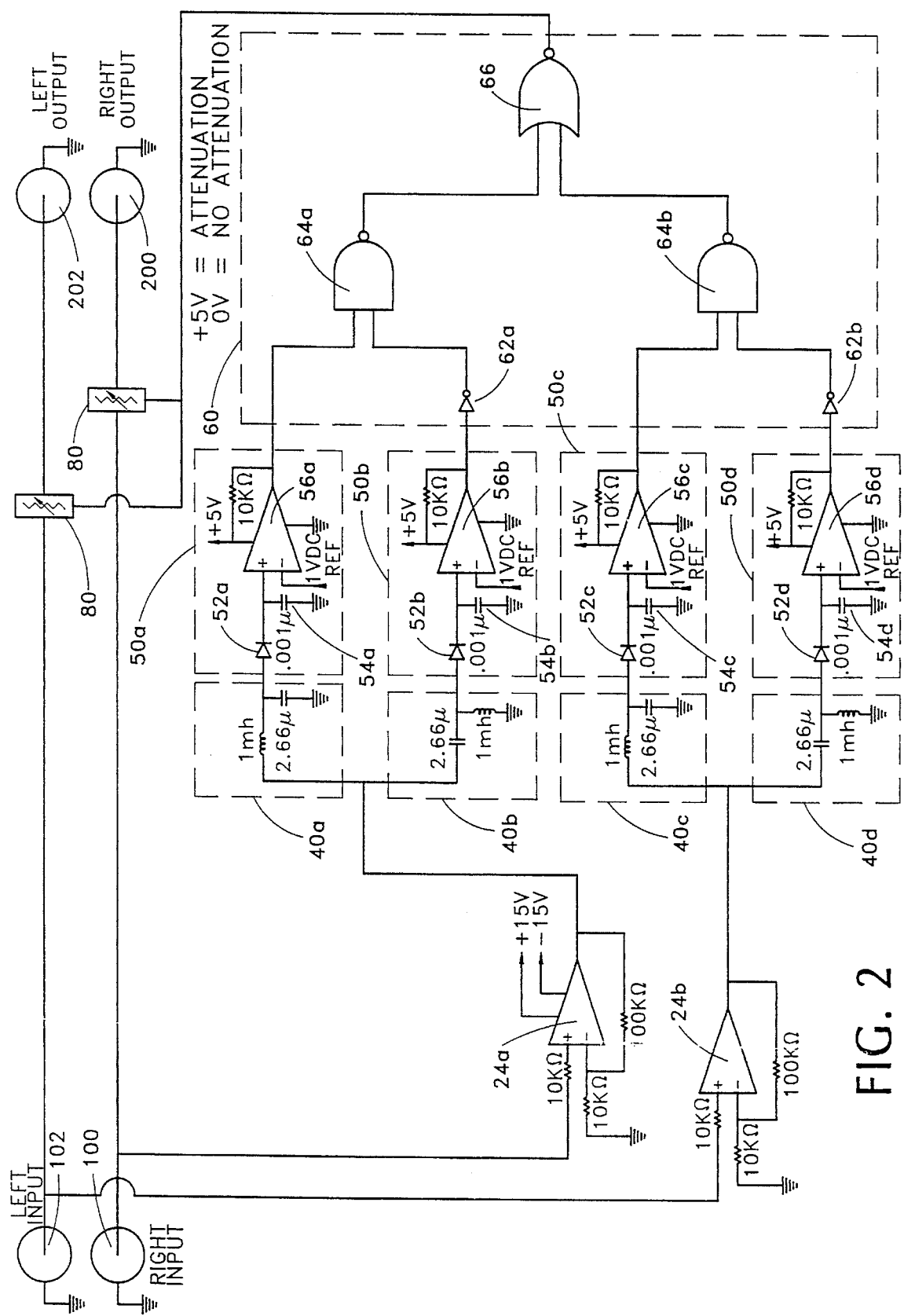
FIG. 2 is a is a detailed schematic diagram of the circuit according to the present invention.

Referring initially now to FIGS. 1 and 2, audio signals from a right input channel 100 and a left input channel 102 are fed into AC operational amplifiers 24a and 24b, respectively, for boosting the signal strength. Operational amplifiers 24a and 24b include simple noninverting, voltage following amplifiers and are well known in the art. The amplified audio signal from the right input channel 100 is then simultaneously passed through a low pass filter circuit 40a and a high pass filter circuit 40b. In a similar fashion, the amplified audio signal from the left input channel 102 is simultaneously passed through a low pass filter circuit 40c and a high pass filter circuit 40d.

The frequency components of the human spoken voice occupy the lower end of the audible frequency range, that is, those frequencies between approximately 20 Hz and approximately 1,000 Hz; further, the audio frequency components generated by musical instruments occupy the higher end of the audible frequency range, that is, those frequencies between approximately 1,000 Hz and approximately 20,000 Hz. Since a principal purpose of the present invention is to detect and attenuate those broadcast signals which include human voice without accompanying music, the circuit of FIGS. 1 and 2 provides circuitry for determining whether a broadcast signal includes frequency components greater than 1 KHz, less than 1 KHz, or both.

With this object in mind and referring again to FIG. 2, the low pass filter circuit 40a connected to the right input channel 100 includes an inductor/capacitor combination which will pass those signals, if any, whose frequency components are less than 1 KHz. In a like fashion, the high pass filter circuit 40b connected to the right input channel 100 includes a capacitor/inductor combination which will pass those signals, if any, whose frequency components are greater than 1 KHz.

If audio signals should be passed through either the low pass filter circuit 40a or the high pass filter circuit 40b of the right input channel 100, then those signals will be detected by signal comparator circuit 50a, connected to the low pass filter circuit 40a, and signal comparator circuit 50b, connected to the high pass filter circuit 40b. Likewise, audio signals passed through the left input channel 102 are similarly detected by signal comparator circuits 50c and 50d. Since signal comparator circuits 50a, 50b, 50c, and 50d include identical components and perform the same function, only one such circuit shall be described herein.

The detector circuit 50a includes a rectifying diode 52a, a filter capacitor 54a, and a DC operational amplifier 56a. A passed AC audio signal from the low pass filter network 40a is inputted to the diode 52a where it is converted to a DC signal and its voltage level maintained by the filter capacitor 54a. The converted DC signal is then passed to the noninverting (+) terminal of the DC operational amplifier 56a. In the present invention, the DC operational amplifier 56a is used as a simple voltage comparator.

Figure 6:
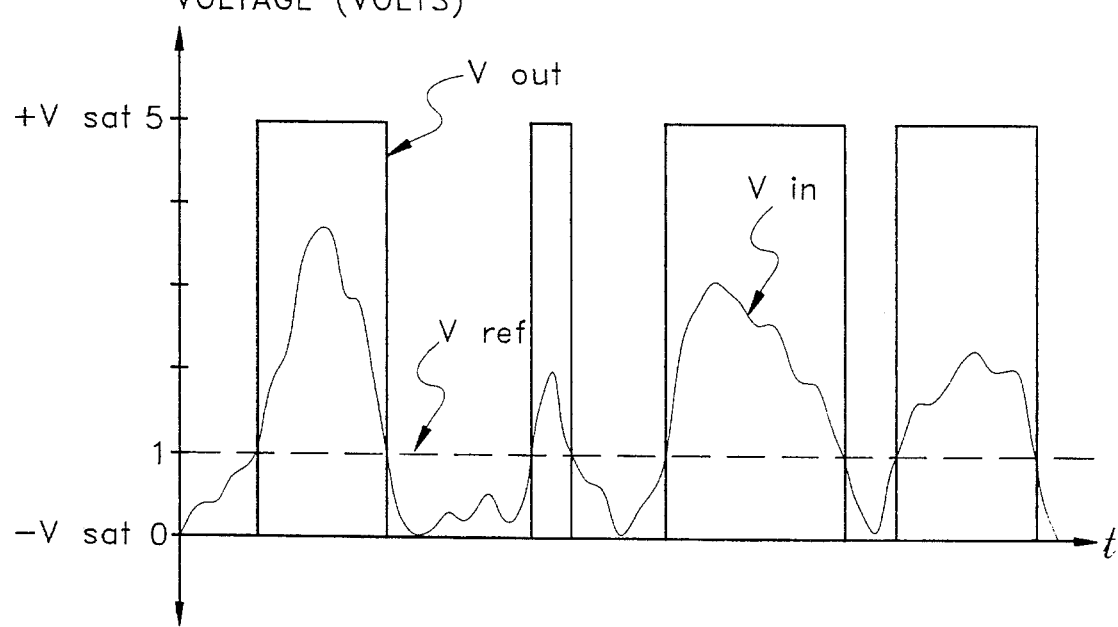
FIG. 6 is a graph illustrating the voltage output characteristic of the DC operational amplifiers as a function of the input voltage and the reference voltage according to the present invention.

The function of amplifier 56a used as a voltage comparator may be illustrated by referring to FIG. 6. The amplifier 56a compares the input DC voltage (designated in FIG. 6 as V in) to a reference voltage of +1 volt (designated as V ref). Whenever V in is slightly greater than V ref, the output voltage of amplifier 56a (V out) will go to +V sat, or +5 volts. On the other hand, if V in is slightly less than V ref, V out will go to −V sat which, in this case, is 0 volts (ground). +V sat and −V sat are chosen as +5 volts and 0 volts, respectively, in order that the output of the amplifier 56a may be suitable for input to digital logic circuitry, described below.

Figure 5:
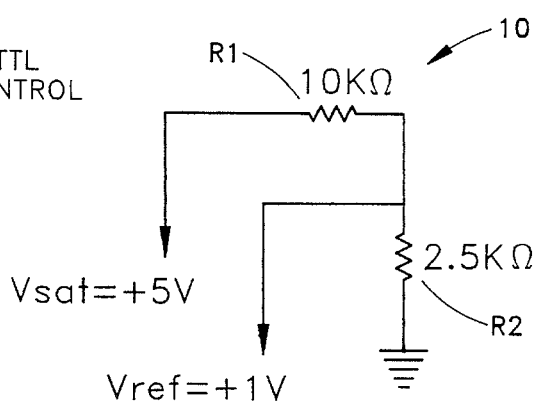
FIG. 5 is a schematic of a voltage divider network used to provide a +1 V DC reference voltage for input to the DC operational amplifiers according to the present invention.

The +1 V DC reference signal, which is inputted to the inverting (−) terminal of the amplifier 56a is obtained using a voltage divider network 10 as illustrated in FIG. 5. The voltage divider network 10 includes resistors R1 and R2 connected in series. Values of R1 and R2 are chosen such that:

$Vref = R2/(R1+R2) * Vsat.$

From the above description, it can be seen that the amplifier 56a will generate a +5 volt output whenever the DC voltage of the signal passed by low pass filter network 40a exceeds +1 volt, and will generate a 0 volt output whenever the DC voltage of the signal passed by low pass filter network 40a is less than +1 volt. The +5 volt output of the amplifier 56a therefore corresponds to detected audio signals whose frequency components are less than 1 KHz, indicating the audio signal of the right input channel 100 contains human voice components. Similarly, a +5 volt output generated by the amplifier 56b corresponds to detected audio signals whose frequency components are greater than 1 KHz, indicating the audio signal of the right input channel 100 contains musical voice components.

Referring again to FIGS. 1 and 2, it should now be noted that the parallel combination of low pass filter circuit 40a, signal comparator circuit 50a, high pass filter circuit 40b, and signal comparator circuit 50b of the right input channel 100 are all duplicated in the left input channel 102 as low pass filter circuit 40c, signal comparator circuit 50c, high pass filter circuit 40d, and signal comparator circuit 50d. Each of the above components connected to the left input channel 102 is identical in form and function to those connected to the right input channel 100.

A digitial logic network 60 is provided to receive an output from each of the four comparator circuits, 50a–d, to determine when a signal attenuating condition exists. Such a condition only arises when voice frequencies without musical frequencies are detected in both the right input channel 100 and the left input channel 102. The logic network 60 accomplishes this function by providing: a first inverter 62a connected to the output of the signal comparator circuit 50b; a second inverter 62b connected to the output of the signal comparator circuit 50d; a first NAND gate 64a, one input of which is connected to the output of the signal comparator circuit 50a, the other input of which is connected to the output the first inverter 62a; a second NAND gate 64b, one input of which is connected to the output of the signal comparator circuit 50c, the other input of which is connected to the output of the second inverter 62b; and a NOR gate 66, one input of which is connected to the output of the first NAND gate 64a, and the other input of which is connected to the output of the second NAND gate 64b.

Figures 3A, 3B:
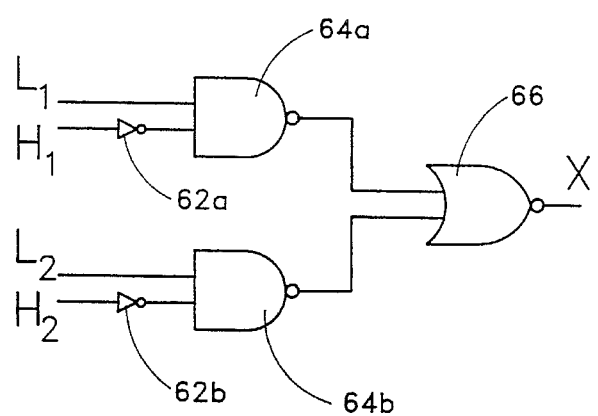
FIG. 3A illustrates a truth table for the digital logic network of the circuit according to the present invention.
FIG. 3B is a digital logic schematic of a section of the circuit according to the present invention.

FIGS. 3A and 3B illustrate the logic function carried out by the digital logic network 60. The attentuating condition is represented by the logical expression $$X = \overline{L_1 \overline{H_1}} + \overline{L_2 \overline{H_2}}$$

where X represents the output of NOR gate 66, $L_1$ represents the input from signal comparator circuit 50A into NAND gate 64a, $H_1$ represents the input from signal comparator circuit 50b into inverter 62a, $L_2$ represents the input from signal comparator circuit 50c into NAND gate 64b, and $H_2$ represents the input from signal comparator circuit 50d into inverter 62b. An attentuating condition results when X=1. There is no attentuation when X=0. FIG. 3A shows that X=1 only when $L_1$=1, $H_1$=0, $L_2$=1 and $H_2$=0. It can be seen that an attenuating condition (represented by a +5 volt output of NOR gate 66) is generated only when voice frequencies without musical frequencies are detected in both the right input channel 100 and the left input channel 102.

Figure 4:
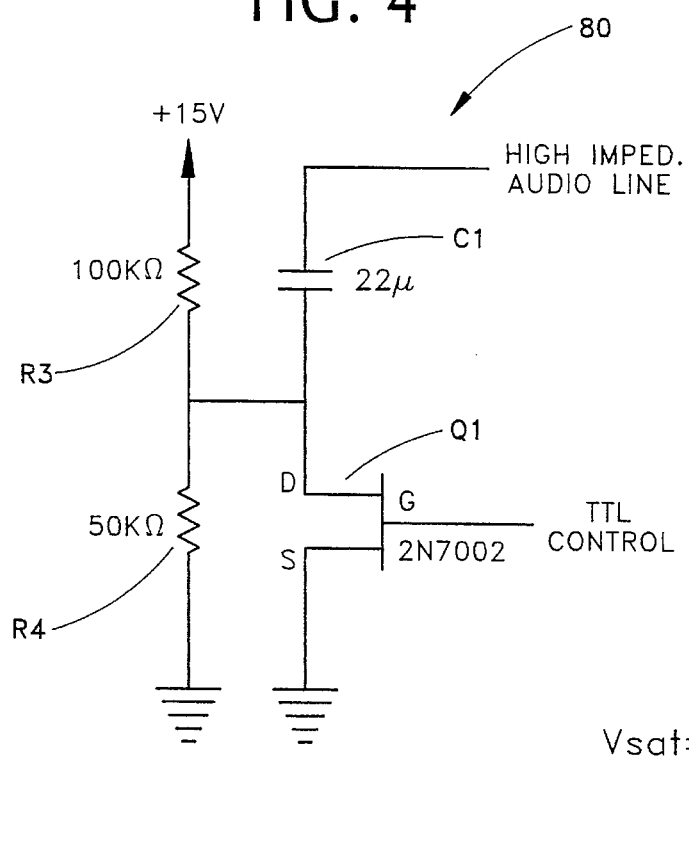
FIG. 4 is a schematic of the low impedance signal attenuating circuit according to the present invention.

Finally, the output signal of the logic network 60 is connected to a low impedance attenuating circuit 80, shown in FIGS. 1 and 2, which is connected in parallel between the right and left input channels 100,102 and right and left output channels 200, 202. As shown in FIG. 4, the attenuating circuit 80 includes a field effect transistor Q1, resistors R3 and R4, and capacitor C1, wherein the drain terminal of transistor Q1 is connected to the capacitor C1, and the source terminal of transistor Q1 is connected to ground. When an attenuating signal is generated (represented by a +5 volt output of NOR gate 66), transistor Q1 turns on, providing a low impedance path through capacitor C1 to ground, thus effectively shunting the audio signals from the load speakers normally connected to output channels 200 and 202.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

What is claimed is:

1. An attenuating circuit for attenuating commercial interruptions in an audio signal, said attenuating circuit comprising:

(a) low pass filter means for receiving said audio signal and for passing only low frequency components of said audio signal, said low frequency components being beneath a determined frequency;

(b) low frequency comparator means for generating a low frequency detection signal whenever the amplitude of said low frequency components exceeds a first threshold value;

(c) high pass filter means for receiving said audio signal and for passing only high frequency components of said audio signal, said high frequency components being above said determined frequency;

(d) high frequency comparator means for generating a high frequency detection signal whenever the amplitude of said high frequency components exceeds a second threshold value;

(e) logic means for receiving said low frequency detection signal and said high frequency detection signal and for generating an attenuating signal whenever said low frequency detection signal is active and said high frequency detection signal is null; and (f) attenuation means four receiving said attenuation signal and for substantially attenuating the strength of said audio signal whenever said attenuation signal is active.

2. An attenuating circuit according to claim 1, wherein said attenuating circuit additionally comprises amplifying means for receiving said audio signal, for amplifying the signal strength of said audio signal to produce an amplified audio signal, and for providing said amplified audio signal to each of said low pass filter means and said high pass filter means.

3. An attenuating circuit according to claim 2, wherein said amplifying means comprises an AC operational amplifier.

4. An attenuating circuit according to claim 3, wherein said low pass filter means comprises an LC low pass filter, said LC low pass filter comprising an inductor connected in series with said AC operational amplifier, and a capacitor connected in parallel with said inductor.

5. An attenuating circuit according to claim 4, wherein said high pass filter means comprises an LC high pass filter, said LC high pass filter comprising a capacitor connected in series with said AC operational amplifier, and an inductor connected in parallel with said capacitor.

6. An attenuating circuit according to claim 5, wherein each of said low frequency comparator means and said high frequency comparator means comprises:

a rectifying diode for rectifying the output of each of said low pass filter means and said high pass filter means;

a filter capacitor connected in parallel with said rectifying diode for detecting and holding a DC signal passed by said rectifying diode; and a DC operational amplifier for comparing said passed DC signal with a DC reference voltage and for generating a DC output signal compatible with digital logic circuitry.

7. An attenuating circuit for attenuating commercial interruptions in an audio signal, said audio signal including at least a first channel audio signal and a second channel audio signal, said attenuating circuit comprising:

a first audio channel detection circuit and a second audio channel detection circuit, each of said first and second audio channel detection circuits comprising:

low pass filter means for receiving said audio signal and for passing only low frequency components of said audio signal, said low frequency components being beneath a determined frequency;

low frequency comparator means for generating a low frequency detection signal whenever the amplitude of said low frequency components exceeds a first threshold value;

high pass filter means for receiving said audio signal and for passing only high frequency components of said audio signal, said high frequency components being above said determined frequency; and high frequency comparator means for generating a high frequency detection signal whenever the amplitude of said high frequency components exceeds a second threshold value;

said attenuating circuit additionally comprising:

logic means for receiving said low frequency detection signals and said high frequency detection signals and for generating an attenuating signal if, and only if, both of said low frequency detection signals are active and both of said high frequency detection signals are null; and attenuation means for receiving said attenuation signal and for substantially attenuating the strength of said audio signal whenever said attenuation signal is active.

8. An attenuating circuit according to claim 7, wherein said attenuating circuit additionally comprises amplifying means for receiving said audio signal, for amplifying the signal strength of said audio signal to produce an amplified audio signal, and for providing said amplified audio signal to each of said low pass filter means and said high pass filter means of said first and second audio channel detection circuits.

9. An attenuating circuit according to claim 8, wherein said amplifying means comprises a first and a second AC operational amplifier.

10. An attenuating circuit according to claim 9, wherein each of said low pass filter means comprises an LC low pass filter, said LC low pass filter comprising an inductor, and a capacitor connected in parallel with said inductor.

11. An attenuating circuit according to claim 10, wherein each of said high pass filter means comprises an LC high pass filter, said LC high pass filter comprising a capacitor, and an inductor connected in parallel with said capacitor.

12. An attenuating circuit according to claim 11, wherein each of said low frequency comparator means and said high frequency comparator means comprises:

a rectifying diode for rectifying the output of each of said low pass filter means and said high pass filter means;

a filter capacitor connected in parallel with said rectifying diode for detecting and holding a DC signal passed by said rectifying diode; and a DC operational amplifier for comparing said passed DC signal with a DC reference voltage and for generating a DC output signal compatible with digital logic circuitry.

13. An attenuating circuit for attenuating commercial interruptions in an audio signal, said audio signal including at least a first channel audio signal and a second channel audio signal, said attenuating circuit comprising:

(a) a first AC noninverting amplifier, the noninverting (+) terminal of which is connected to said first channel audio signal, the inverting (−) terminal of which is connected to the output of the said first noninverting amplifier through a negative feedback resistor for fixing and stabilizing the gain of the said first noninverting amplifier;

(b) a second AC noninverting amplifier, the noninverting (+) terminal of which is connected to said second audio channel, the inverting (−) terminal of which is connected to the output of the said second noninverting amplifier through a negative feedback resistor for fixing and stabilizing the gain of the said second noninverting amplifier;

(c) a first low pass filter circuit connected to the output of the said first AC noninverting amplifier, said first low pass filter circuit comprising an LC low pass filter which further comprises an inductor connected in series with the output of the said first AC noninverting amplifier, and a capacitor being connected in parallel with said inductor;

(d) a first high pass filter circuit connected to the output of the said first AC noninverting amplifier, said first high pass filter circuit comprising an LC high pass filter which further comprises a capacitor connected in series with the output of the said first AC noninverting amplifier, and an inductor being connected in parallel with said capacitor;

(e) a second low pass filter circuit connected to the output of the said second AC noninverting amplifier, said second low pass filter circuit comprising an LC low pass filter which further comprises an inductor connected in series with the output of the said second AC noninverting amplifier, and a capacitor being connected in parallel with said inductor;

(f) a second high pass filter circuit connected to the output of the said second AC noninverting amplifier, said second high pass filter circuit comprising an LC high pass filter which further comprises a capacitor connected in series with the output of the said second AC noninverting amplifier, and an inductor being connected in parallel with said capacitor;

(g) a first signal comparator circuit comprising a rectifying diode serially connected to the output of the said first low pass filter circuit, a filter capacitor connected in parallel to the output of the said rectifying diode for detecting and holding a passed DC signal, and a DC operational amplifier which compares the said passed DC signal with a DC reference voltage and which generates an output suitable for input to digital logic circuitry;

(h) a second signal comparator circuit comprising a rectifying diode serially connected to the output of the said first high pass filter circuit, a filter capacitor connected in parallel to the output of the said rectifying diode for detecting and holding a passed DC signal, and a DC operational amplifier which compares the said passed DC signal with a DC reference voltage and which generates an output suitable for input to digital logic circuitry;

(i) a third signal comparator circuit comprising a rectifying diode serially connected to the output of the said second low pass filter network, a filter capacitor connected in parallel to the output of the said rectifying diode for detecting and holding a passed DC signal, and a DC operational amplifier which compares the said passed DC signal with a DC reference voltage and which generates an output suitable for input to digital logic circuitry;

(j) a fourth signal comparator circuit comprising a rectifying diode serially connected to the output of the said second high pass filter network, a filter capacitor connected in parallel to the output of the said rectifying diode for detecting and holding a passed DC signal, and a DC operational amplifier which compares the said passed DC signal with a DC reference voltage and which generates an output suitable for input to digital logic circuitry;

(k) a digital logic circuit comprising a first inverter connected to the output of the said DC operational amplifier of the said second signal comparator circuit; a second inverter connected to the output of the said DC operational amplifier of the said fourth signal comparator circuit; a first NAND gate, one input of which is connected to the output of the said DC operational amplifier of the said first signal comparator circuit, the other input of which is connected to the output of the said first inverter; a second NAND gate, one input of which is connected to the output of the said DC operational amplifier of the said third signal comparator circuit, the other input of which is connected to the output of the said second inverter; and a NOR gate, one input of which is connected to the output of the said first NAND gate, the other input of which is connected to the output of the said second NAND gate; and (l) a low impedance signal attenuating circuit connected in parallel between an input and an output of each of the said first and second audio channels, said low impedance attenuating circuit being activated by a signal connected to the output of the said NOR gate, wherein a +5 volt output from the said NOR gate causes the said low impedance signal attenuating circuit to substantially attenuate the strength of said first and second channel audio signals.

14. An attenuating circuit according to claim 13, wherein each of the said DC reference voltages are +1 volt and are obtained from the power supply of each of the said DC operational amplifiers by using voltage dividing resistors.

* * * * *